(12) United States Patent
Dutrey et al.

(10) Patent No.: US 12,372,578 B2
(45) Date of Patent: Jul. 29, 2025

(54) METHOD FOR DETECTING A STRUCTURAL FAULT OF AN ELECTRIC MOTOR

(71) Applicant: Schneider Toshiba Inverter Europe SAS, Pacy sur Eure (FR)

(72) Inventors: Alain Dutrey, Fontaine-sous-Jouy (FR); Saïd Talbi, Amiens (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 175 days.

(21) Appl. No.: 18/195,976

(22) Filed: May 11, 2023

(65) Prior Publication Data

US 2023/0366933 A1 Nov. 16, 2023

(30) Foreign Application Priority Data

May 13, 2022 (EP) .................................... 22305717

(51) Int. Cl.
*G01R 31/34* (2020.01)
*H02H 7/093* (2006.01)

(52) U.S. Cl.
CPC .......... *G01R 31/343* (2013.01); *H02H 7/093* (2013.01)

(58) Field of Classification Search
CPC .................................................. G01R 31/343
See application file for complete search history.

(56) References Cited

U.S. PATENT DOCUMENTS

| 2006/0186851 | A1* | 8/2006 | Nguyen Phuoc | ......... H02P 1/30 318/609 |
| 2016/0025811 | A1* | 1/2016 | Kasztenny | ........... G01R 31/343 324/765.01 |
| 2020/0348207 | A1 | 11/2020 | Wang et al. | |

OTHER PUBLICATIONS

Schoen, R. R. et al., "An Unsupervised, On-Line System for Induction Motor Fault Detection Using Stator Current Monitoring", Industry Applications Society Annual Meeting, 1994, Conference Record of the 1994 IEEE Denver, CO, Oct. 2-6, 1994, pp. 103-109.
Zhou, Wei et al., "Stator Current-Based Bearing Fault Detection Techniques: A General Review", Diagnostics for Electric Machines, Power Electronics and Drives, 2007, IEEE International Symposium, Sep. 1, 2007, pp. 7-10.

(Continued)

*Primary Examiner* — Alesa Allgood
(74) *Attorney, Agent, or Firm* — Troutman Pepper Locke LLP

(57) ABSTRACT

A method for detecting a structural fault of an electric motor. The method includes: (i) acquiring a measurement signal of a physical parameter representative of the rotation of the electric motor, (ii) obtaining the high frequency component of the measurement signal, resulting in a corrected signal, (iii) applying a set of band-pass filters to the corrected signal resulting in a set of filtered corrected signals, (iv) determining a stator frequency and a rotor frequency, (v) computing a frequency signature vector, (vi) computing a temporal symptom vector from the frequency signature vector and the set of filtered corrected signals, and (vii) detecting a structural fault of the electric motor from the determined temporal symptom vector and from a classifier model.

20 Claims, 7 Drawing Sheets

(56) References Cited

OTHER PUBLICATIONS

Ouachtouk, Ilias et al., "Detection and classification of broken rotor bars faults in induction machine using K-means classifier", 2nd International Conference on Electrical and Information Technologies (ICEIT), IEEE, May 4, 2016, pp. 180-185.

European Search Report and Search Opinion dated Nov. 7, 2022 for corresponding European Patent Application No. EP22305717.5, 7 pages.

* cited by examiner

METHOD FOR DETECTING A STRUCTURAL FAULT OF AN ELECTRIC MOTOR

TECHNICAL FIELD

The present disclosure relates to the field of the control of electric motors, and more particularly to methods for detecting an anomaly in the operation of the motor.

BACKGROUND ART

Electric motors are frequently used in industry, for a wide range of applications. Depending on the target application, the power range may extend from a few kilowatts to around one megawatt. Examples of application are for example pumps of various power range, or crates, or also rolling mills, for the most powerful motors. These motors, in particular induction motors, are thus integrated into complex mechanical assemblies. In order to maximize production time and minimize down-time, it is desirable to monitor the operation of these mechanical assemblies during their use, in order to detect operating anomalies and remedy them before a breakdown occurs.

A well-known detection method uses the control signals of electric motors to detect different types of operating anomalies. This method, called "Motor current signature analysis", is based on the analysis of the motor currents. For example, a frequency analysis of the motor currents is classically used for on-line monitoring of motors used in industrial applications. This method enables to detect different types of mechanical and electrical faults while the equipment is operated.

For example, a misalignment of the motor shaft with respect to the load to be driven can be detected, as well as an unbalance of the rotating assembly, or even a damaged bearing.

This method gives interesting results, in particular when the equipment is used under steady state conditions. During transient phases, where changes in rotation speed and/or delivered torque occur, the detection becomes less effective since the signal variations caused by the fault to be detected become difficult to differentiate from the variations due to changes in operating conditions.

There is therefore a need to propose a method of improved robustness so that mechanical or electrical faults can be detected with an improvement accuracy under a wider range of operating conditions, particularly under transient conditions.

SUMMARY

To this end, it is proposed a method for detecting a structural fault of an electric motor, comprising the steps:
(i) Acquiring, during an acquisition window of predetermined duration, a measurement signal of a physical parameter representative of the rotation of the electric motor, at a predefined sampling frequency,
(ii) Obtaining the high frequency component of the measurement signal, resulting in a corrected signal,
(iii) Applying a set of band-pass filters to the corrected signal, each band-pass filter having a central frequency and a bandwidth, the central frequencies of the band-pass filters being in ascending order and the bandwidth being separated from each other, each band-pass filter having an index corresponding to the rank of the central frequency in a sorted list of the central frequencies, resulting in a set of filtered corrected signals,
(iv) Determining a stator frequency and a rotor frequency of the electric motor,
(v) Computing a frequency signature vector comprising a plurality of components, each component of the frequency signature vector being a predefined linear combination of the stator frequency and of the rotor frequency, from the equation:

$$FSV_k = a_k * Fs + b_k * Fr,$$

the coefficients $a_k$, $b_k$ being predefined integers,
(vi) Computing a temporal symptom vector from the computed frequency signature vector and from the set of filtered corrected signals, the temporal symptom vector comprising a plurality of components, the computation comprising the sub-steps:
(vi-1) For each time sample ($t_i$) of the acquisition window and each component of the frequency signature vector, selecting the band-pass filter of central frequency which is closest to the value for time sample ($t_i$),
(vi-2) Affecting the output value of the selected band-pass filter to the component number k of the temporal symptom vector for time sample ($t_i$),
(vi-3) Iterating steps (vi-1) and (vi-2) for all time samples of the acquisition window, resulting in a temporal symptom vector,
(vii) Detecting a structural fault of the electric motor from the determined temporal symptom vector and from a classifier model.

This approach in which a temporal signal is passed in parallel through a set of band-pass filters allows to access the frequency content of the signal while remaining in the time domain. Unlike classical approaches based on frequency domain analysis like for example Fourier transforms, the proposed approach is self-adaptive to the changes in operating conditions. Indeed, when the speed of the motor changes, the filter that will be selected for generating the temporal system vector will be modified and naturally adapted to the new conditions. The robustness of the detection method is improved, as small signals variations caused by structural faults can be better differentiated from variations due evolutions in operating conditions.

The following features can optionally be implemented, separately or in combination one with the others:

The structural fault to be detected may be a mechanical fault.

The structural fault to be detected may be an electrical fault.

The electric motor can be an induction motor.

The electric motor is configured for driving a mechanical load.

The mechanical load driven by the electric motor can be the rotating parts of a pump, or the lifting mechanism of a crane, or a roller of a rolling mill.

The electric motor is coupled to the mechanical load by a coupling mechanism. The coupling mechanism may comprise a geartrain. The coupling mechanism may comprise a transmission belt.

The predefined duration is comprised between 0.2 second and 5 seconds. The predefined duration is for example equal to 2 seconds.

The sampling frequency is comprised between 200 Hz and 5000 Hz. The sampling frequency is for example equal to 500 Hz.

In an embodiment, the measurement signal is a normalized signal, i.e the measurement signal is expressed as a percentage of a predefined variation range of a raw signal.

The step of acquiring a measurement signal comprises an initial step of acquiring a raw signal and dividing the acquired raw signal by a predefined constant, resulting in the measurement signal.

In an embodiment of the method:
At step (iii), the central frequencies of the set of band-pass filters form a arithmetic progression of common difference (R), and
the bandwidth of the set of band-pass filters is constant,
At step (vi-1) the band-pass filter of central frequency which is closest to the value for time sample ($t_i$) is selected by calculating the rounded value of the ratio of the value and of the common difference (R), the index of the selected filter being equal to the calculated rounded value.

In an embodiment of the method, the step of obtaining the high frequency component of the measurement signal comprises the sub-steps:
(ii-1) applying a low-pass filter to the acquired measurement signal, resulting in a filtered value,
(ii-2) subtracting the filtered value from the acquired measurement signal, resulting in the corrected signal.

In an alternative embodiment, the step of obtaining the high frequency component of the measurement signal comprises the sub-steps:
(ii-1) applying a high-pass filter to the acquired measurement signal, resulting in the corrected signal.

In an embodiment of the method, the physical parameter representative of the rotation of the electric motor is a rotational speed of a rotor of the electric motor.

The rotational speed can be determined by a speed/torque controller controlling the electric motor.

The rotational speed can be determined by a speed sensor fitted on an output shaft of the electric motor.

In a variant of the method, the physical parameter representative of the rotation of the electric motor is a rotational speed of electrical frame of a stator of the electric motor.

In another embodiment of the method, the physical parameter representative of the rotation of the electric motor may be a torque delivered by the electric motor.

The torque signal may be determined by a speed/torque controller.

The torque signal may be determined by a torque meter fitting on the output shaft of the electric motor.

In another embodiment of the method, the physical parameter representative of the rotation of the electric motor is a phase current of a stator of the electric motor.

The common difference of the central frequencies of the set of band-pass filters is for example 2.5 Hz.

The bandwidth of each band-pass filter is for example 2 Hz.

The set of band-pass filters may comprise between 20 filters and 200 filters. The set of band-pass filters may for example comprise 100 filters.

There is no frequency overlap between a filter of index k and the filter of immediately inferior index or the filter of immediately superior index.

In an embodiment of the method, the signature vector comprises 4 components, with:
the first component equal to the stator frequency,
the second component equal to the sum of stator frequency and rotor frequency,
the third component equal to the stator frequency multiplied by a factor of 2,
the fourth component equal to the sum of the stator frequency multiplied by a factor of 3 and the rotor frequency.

In an embodiment of the detection method, at step (vi-2) the output value of the selected band-pass filter is a root mean square value of all the instant values taken by the selected band-pass filter between the start of the acquisition window and the time sample ($t_i$).

According to an aspect of the method, the method comprises the steps:
(viii) Determining an average power vector of the temporal symptom vector over the acquisition window,
(ix) Detecting a structural fault of the electric motor from the determined average power and from the classifier model.

In an embodiment of the method, each component of the average power vector is determined from the root mean square value of the corresponding component of the temporal symptom vector over the acquisition window.

In an embodiment of the method, the steps (i) to (vii) are iterated with a rotational speed of a rotor of the electric motor as the physical parameter representative of the rotation of the electric motor and in which the steps (i) to (vii) are iterated in parallel with a torque delivered by the electric motor as the physical parameter representative of the rotation of the electric motor.

According to an aspect of the method, the steps (i) to (vii) are iterated for a set of acquisition windows, resulting in a set of data representative of the operation of the electric motor.

In an embodiment of the method, the classifier model is a machine learning classifier.

According to an aspect of the method, the machine learning classifier is trained, in a calibration phase, with a first set of data representative of an operation of the electric motor in nominal condition and with at least a second set of data representative of an operation of the electric motor with a structural fault to be detected.

Preferably, the machine learning classifier is trained with a plurality of sets of data, each set of data corresponding to a structural fault to be detected.

When the load is driven by a transmission belt, transmission belt overtension and undertension can be detected, as well as partially cracked transmission belt. When the load is driven by a geartrain, damaged gear may be detected. When the electric motor drives a pump, the occurrence of cavitation of the pump can be detected.

In an embodiment of the method, the machine learning classifier can be a neural network, for example a convolutional neural network.

The neural network may comprise an input layer with a number of neurons comprised between 2 and 20.

The neural network may comprise a number of hidden layers comprised between 2 and 5.

The neural network may comprise an output layer with a number of neurons comprised between 2 and 20.

According to an aspect of the method, the method comprises the step:
(x) emitting an alarm signal if a structural fault of the electric motor is detected.

The alarm signal may be a message displayed on a control screen.

The alarm signal may be a fault code stored in a motor controller.

The alarm signal may be a sound signal.

The disclosure also relates to an electronic module configured for implementing a method as described earlier.

The electronic module may be a speed/torque controller of the electric motor.

In another embodiment, the electronic module may be a dedicated monitoring system.

BRIEF DESCRIPTION OF DRAWINGS

Other features, details and advantages will be shown in the following detailed description and on the figures, on which.

DESCRIPTION OF EMBODIMENTS

In order to make the figures easier to read, the various elements are not necessarily represented to scale. In these figures, identical elements receive the same reference number. Certain elements or parameters can be indexed, that is to say designated for example by 'first element' or second element, or first parameter and second parameter, etc. The purpose of this indexing is to differentiate elements or parameters that are similar, but not identical. This indexing does not imply a priority of one element, or one parameter over another, and their names can be interchanged. When it is mentioned that a subsystem comprises a given element, the presence of other elements in this subsystem is not excluded.

Figure 1:
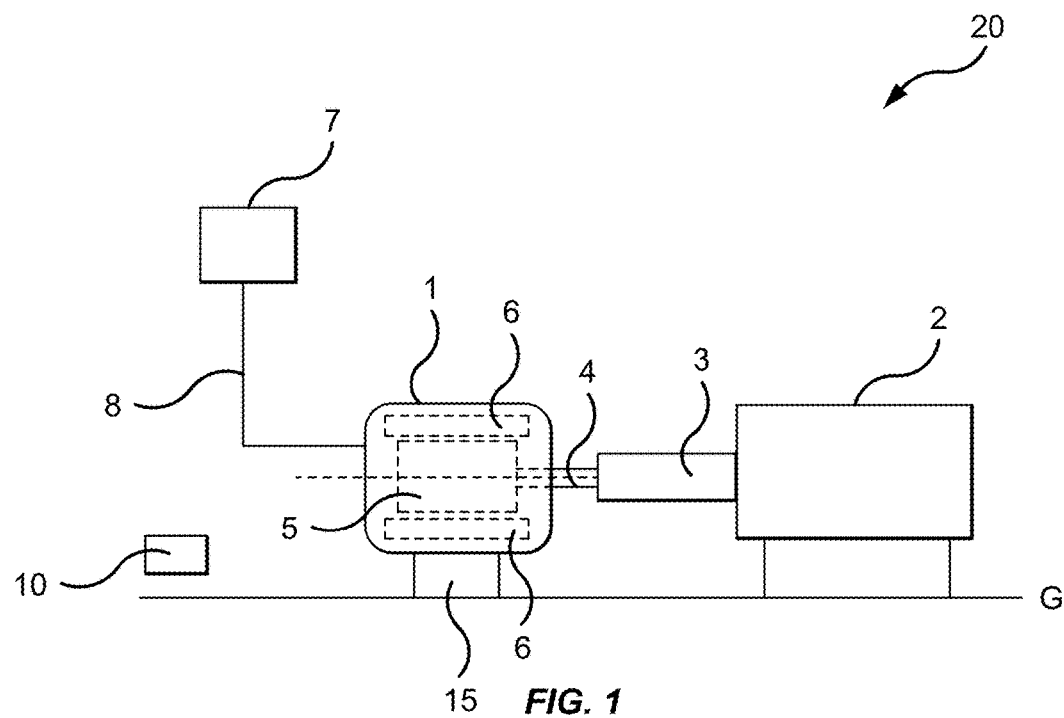
FIG. 1 is a schematic view of an industrial equipment comprising an electric motor.

FIG. 1 illustrates schematically an industrial equipment 20. This industrial equipment comprises an electric motor 1 and a mechanical load 2. The electric motor 1 is configured for driving the mechanical load 2. The mechanical load 2 driven by the electric motor 1 can for example be the rotating parts of a pump, or the lifting mechanism of a crane, or a roller of a rolling mill. Other applications are of course possible.

The electric motor 1 is coupled to the mechanical load 2 by a coupling mechanism 3. The coupling mechanism 3 may comprise a geartrain. The coupling mechanism 3 may comprise a transmission belt.

The electric motor 1 can be an induction motor. The electric motor 1 comprises a rotor 5 and a stator 6. The electric motor 1 is controlled by an electronic controller 7 which provides electric current to each phase of the stator 6.

The industrial equipment 20 comprises many individual elements linked together and forming a complex mechanical system. Various type of faults may affect this mechanical system. For example, the electric motor 1 itself may have mechanical faults like for example rotor unbalance, rotor warp, damaged bearing. Mechanical faults relating to the integration of the electric may also occur, like incorrect fixing of the electric motor 1 on its frame 15 or to the ground G, incorrect alignment of motor with transmission mechanism 3. When the transmission mechanism 3 includes a transmission belt, the tension of the transmission belt may be incorrect, with either over-tension or under-tension. When the transmission mechanism 3 comprises a gear train, one tooth or several teeth of one or more gear may be damaged. The mechanical load driven by the electric motor 1 may also experience an operation fault, like cavitation in case of a pump. Cavitation generates shock waves on the impeller of the pump, which in turn are transmitted to the transmission mechanism and the electric motor 1 and may deteriorate the equipment. Finally, the electric motor 1 may experience electrical faults, such as a rotor bar crack, or an insulation fault between for example some stator windings. This list is not comprehensive.

In the context of this disclosure, the wording 'structural fault' encompasses anomalous events that may compromise the long-term operation of the equipment, without preventing its short-term operation. For example, a misalignment of the transmission mechanism 3 will not stop the equipment from operating with its nominal performance in the short-term. Nevertheless, it will likely result in the long term in a premature wearing of a bearing of the rotor, which in turn may later cause a complete failure of the electric motor 1, requiring down-time of the industrial equipment 20 for servicing or repairs. The structural faults are somehow early warnings of possible failures that are likely to occur at a later stage if the structural fault is not addressed. The structural fault to be detected may be a mechanical fault. The structural fault to be detected may be an electrical fault.

The goal of the proposed method is to provide a reliable detection of a broad panel of structural faults.

The proposed method for detecting a structural fault of an electric motor 1, comprises the steps:

(i) Acquiring, during an acquisition window W of predetermined duration DW, a measurement signal S of a physical parameter representative of the rotation of the electric motor 1, at a predefined sampling frequency f, (ii) Obtaining the high frequency component of the measurement signal S, resulting in a corrected signal S_cor, (iii) Applying a set of band-pass filters (F-1, . . . , F-n) to the corrected signal S_cor, each band-pass filter (F-1, . . . , F-n) having a central frequency (c-1, . . . , c-n) and a bandwidth (q-1, . . . , q-n), the central frequencies of the band-pass filters (F-1, . . . , F-n) being in ascending order and the bandwidth (q-1, . . . , q-n) being separated from each other, each band-pass filter (F-1, . . . , F-n) having an index (1, . . . , n) corresponding to the rank of the central frequency in a sorted list of the central frequencies (c-1, . . . , c-n), resulting in a set of filtered corrected signals (FS_cor-1, . . . , FS_cor-n), (iv) Determining a stator frequency Fs and a rotor frequency Fr of the electric motor 1, (v) Computing a frequency signature vector FSV comprising a plurality of components ($FSV_1$, . . . , $FSV_p$), each component $FSV_k$ of the frequency signature vector FSV being a predefined linear combination of the stator frequency Fs and of the rotor frequency Fr, from the equation:

$$FSV_k = a_k * Fs + b_k * Fr,\qquad\text{(equation 1)}$$

the coefficients $a_k$, $b_k$ being predefined integers,
- (vi) Computing a temporal symptom vector TSV from the computed frequency signature vector FSV and from the set of filtered corrected signals (FS_cor-1, ..., FS_cor-n), the temporal symptom vector TSV comprising a plurality of components (TSV$_1$, ..., TSV$_p$), the computation comprising the sub-steps:
- (vi-1) For each time sample $t_i$ of the acquisition window W and each component FSV$_k$ of the frequency signature vector FSV, selecting the band-pass filter F-r of central frequency c-r which is closest to the value FSV$_k$ for time sample $t_i$,
- (vi-2) Affecting the output value of the selected band-pass filter F-r to the component number k TSV$_k$ of the temporal symptom vector TSV for time sample $t_i$,
- (vi-3) Iterating steps (vi-1) and (vi-2) for all time samples of the acquisition window W, resulting in a temporal symptom vector TSV,
- (vii) Detecting a structural fault of the electric motor 1 from the determined temporal symptom vector TSV and from a classifier model.

In the proposed detection method, a temporal signal is passed in parallel through a set of band-pass filters, whose bandwidths are separated from each other. By temporal signal, it is meant a signal which is function of time. By this way, the frequency content of the temporal signal may be accessed to, while remaining in the time domain since each filter delivers an output value at different instants. The proposed method is therefore self-adaptive to the changes in the operating conditions, like rotation speed, or torque. When the speed of the motor changes, the band-pass filter that will be selected for generating the temporal system vector will be modified in real time and naturally adapted to the new operating conditions. The robustness of the detection method is improved compared to conventional methods, based for example on Fourier transforms, that operate purely in the frequency domain and have difficulties dealing with evolutions of operating conditions.

Figure 2:
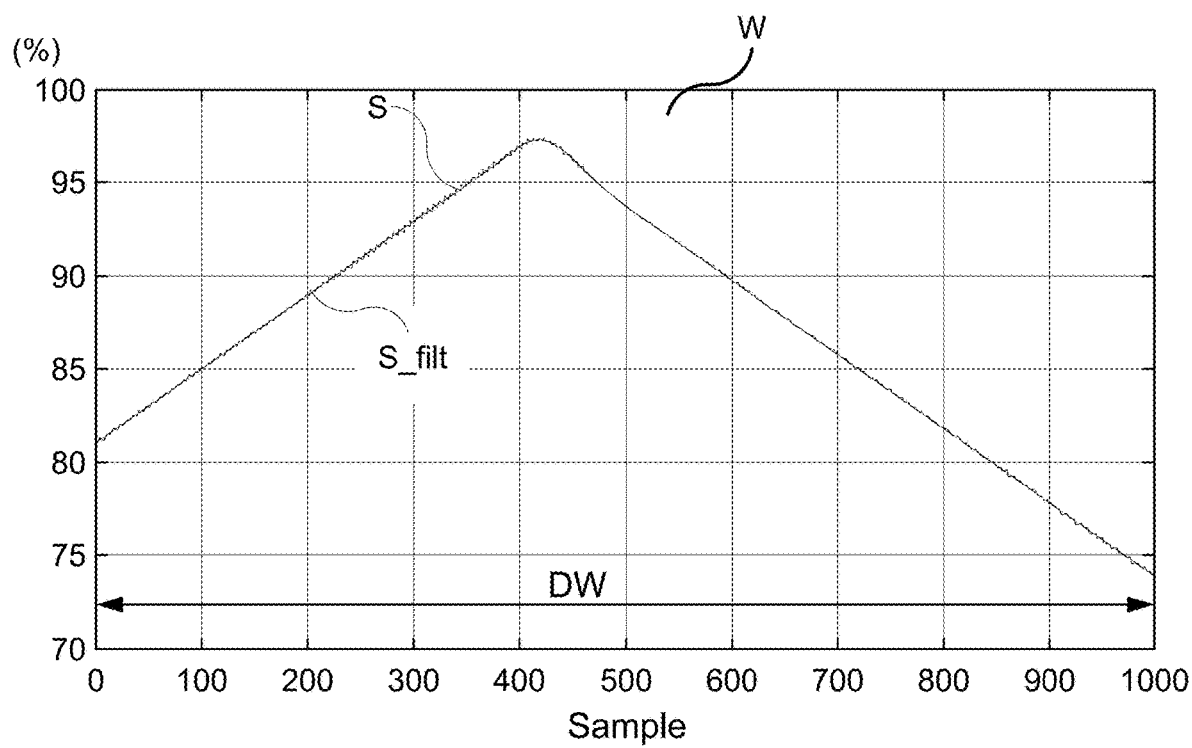
FIG. 2 is a time chart illustrating one step of an embodiment of the proposed detection method.
Figure 3:
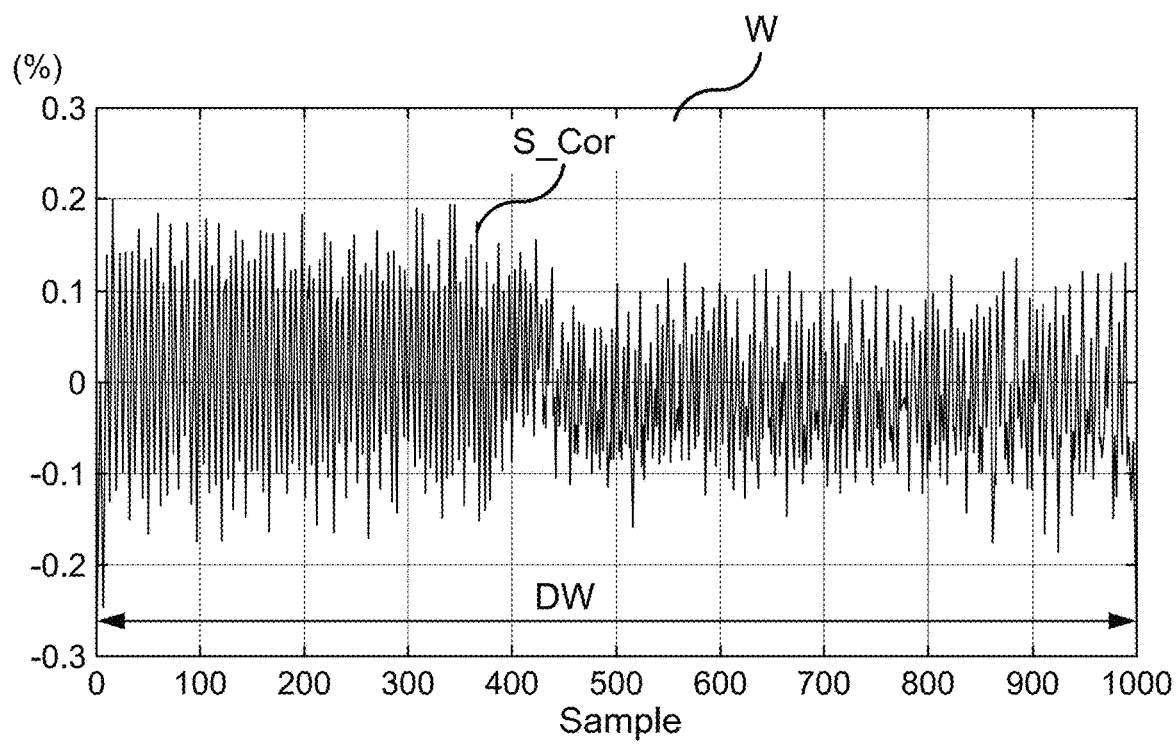
FIG. 3 is a time chart illustrating another step of the embodiment of FIG. 2.
Figure 4:
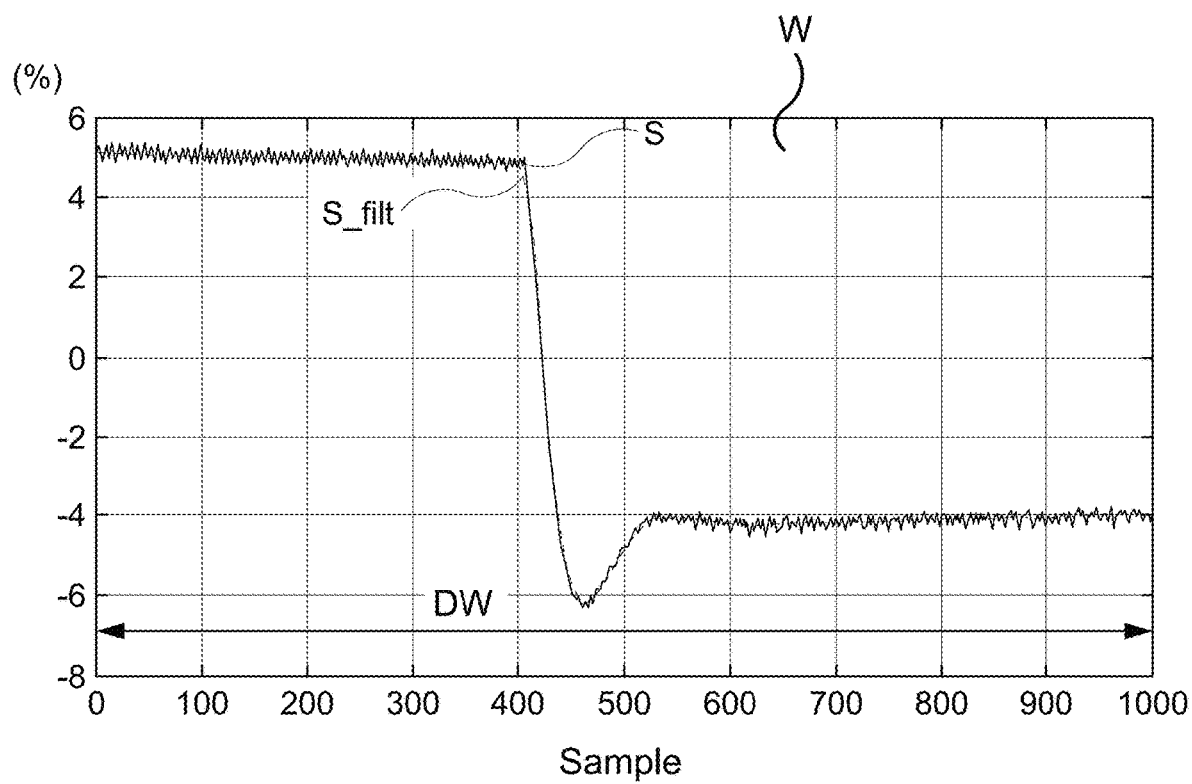
FIG. 4 is a time chart illustrating one step of an another embodiment of the detection method.

In an embodiment of the method, illustrated on FIG. 2 and FIG. 3, the physical parameter representative of the rotation of the electric motor 1 is a rotational speed of a rotor 5 of the electric motor 1. In other words, the measurement signal S is the measured rotation speed of the electric motor 1. The rotational speed can be determined by a speed/torque controller 7 controlling the electric motor 1. In that case, the rotational speed is an internal parameter of the speed/torque controller 7. The rotational speed can also be determined by a dedicated speed sensor fitted on an output shaft 4 of the electric motor 1. FIGS. 2 to 4 represent the evolution of the measured signal versus time, or versus sample number.

In a variant of the method, the physical parameter representative of the rotation of the electric motor 1 is a rotational speed of an electrical frame of a stator 6 of the electric motor 1.

Figure 5:
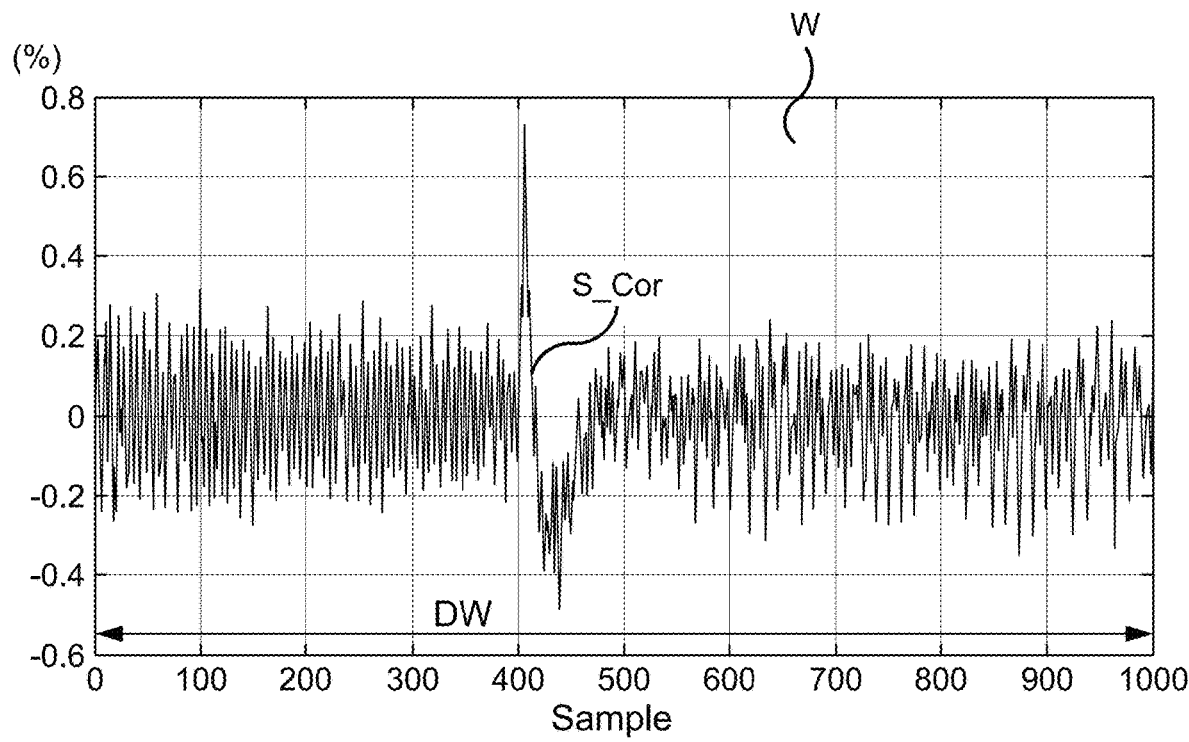
FIG. 5 is a time chart illustrating another step of the embodiment of FIG. 4.

In another embodiment of the method, illustrated on FIG. 4 and FIG. 5, the physical parameter representative of the rotation of the electric motor 1 may be a torque delivered by the electric motor 1. The measurement signal S is in this case the measured mechanical torque supplied by the electric motor 1. The torque signal may be determined by a speed/torque controller 7. The torque signal may also be determined by a torquemeter fitted on the output shaft of the electric motor 1.

In another embodiment of the method, the physical parameter representative of the rotation of the electric motor 1 is a phase current I of a stator 6 of the electric motor 1. The proposed method can be implemented with either one of the listed parameters, or a combination of these parameters.

The signal acquisition is carried out during an acquisition window W. The acquisition window W is a time acquisition window. The predefined duration DW is for example comprised between 0.2 second and 5 seconds. On the examples illustrated on the different figures, the predefined duration DW is equal to 2 seconds.

The sampling frequency f of the measurement signal S is comprised between 200 Hz and 5000 Hz. On the examples of FIGS. 2 to 4 and 8 to 10, the sampling frequency f is equal to 500 Hz. On these figures, the acquisition window W comprises 1000 samples. Sample number is indicated on the X-axis and is equivalent to the time since sampling frequency is constant.

Each vector that will be mentioned in the present disclosure corresponds to a given time sample. In other words, each of different components of a vector take a certain value for a given time sample $t_i$, and take another value for another time sample $t_j$, with j different from i.

On the illustrated example, the measurement signal S is a normalized signal, i.e the measurement signal S is expressed as a percentage of a predefined variation range of a raw measured signal.

For this, the step (i) of acquiring a measurement signal S comprises an initial step of acquiring a raw signal Sraw and dividing the acquired raw signal Sraw by a predefined constant, resulting in the measurement signal S.

When the measurement signal S is the rotation speed of the electric motor, as illustrated on FIG. 2, the measurement signal S can vary between 0% and 100% once normalized. 0% corresponds to the rotor being still, and 100% corresponds to the maximum rotation speed that can be accepted by the electric motor 1. The raw signal Sraw is acquired for example in revolution per minute, and the measurement signal S used by the subsequent steps of the proposed method is expressed in percent of the full speed range.

When the measurement signal S is the torque delivered by the electric motor 1, as illustrated on FIG. 4, the measurement signal S can vary between −100% and +100%, +100% corresponding to the maximum driving torque of the electric motor 1 and −100% being the maximum resisting torque of the electric motor 1. The raw signal is in that case acquired for example in Newton.meter and is then normalized, i.e converted into percents of a predefined scale. The predefined scale is adapted to the speed range and/or torque range of each specific application. The proposed method is generic, i.e can be used for different applications with varying ranges of speed/torque.

The general shape of the measurement signal S illustrated on FIG. 2 shows a slow drift, on which high frequency ripples are superimposed. The measurement signal S, which is on this FIG. 2 a normalized signal, increases regularly from about 82% for the first acquired sample to about 97% approximately for sample n° 410, then decreases regularly down to about 73% for sample n° 1000 of the acquisition window W. Small amplitude, high frequency ripples are present on the signal S. The high frequency component corresponds to the fast fluctuations of the signal, while the low frequency component corresponds to the slow variations. The proposed method relies on the high frequency component of the measurement signal S, which means that the slow variation is first filtered out.

For this, the step (ii) of obtaining the high frequency component of the measurement signal S comprise the sub-steps:
(ii-1) applying a low-pass filter to the acquired measurement signal S, resulting in a filtered value S_filt,
(ii-2) subtracting the filtered value S_filt from the acquired measurement signal S, resulting in the corrected signal S_cor).

FIG. 3 represents the corrected signal S_Cor extracted from the data of FIG. 2, thus corresponding to the difference (S−S_filt).

Similarly, FIG. 5 represents the corrected signal S_Cor extracted from the data of FIG. 4. On FIG. 4, the measurement signal remains approximately constant from the first sample until sample 400, where a step takes place. Samples 400 to about 520 correspond to the transition to the new steady conditions which lasts from samples 520 up to 1000. The corrected signal S_Cor, on FIG. 5, shows oscillation around 0 when the steady state conditions are obtained and large peaks during the transient phase, from samples approximately n° 410 to 500.

In an alternative embodiment, the step of obtaining the high frequency component of the measurement signal S may comprise the sub-steps:
(ii-1) applying a high-pass filter to the acquired measurement signal S, resulting in the corrected signal S_cor.

The obtained results are equivalent. Other methods of extracting the high frequency content of the acquired measurement signal S can also be used.

Then, at step (iii), the corrected signal S_Cor is filtered in parallel by a set of band-pass filters (F-1, ..., F-n). F-1 is the first filter in the set of pass-band filters, indexed 1, F-2 the second filter, indexed 2, ..., and F-n is the filter of index n. The set of band-pass filters may comprise between 20 filters and 200 filters. The set of band-pass filters may for example comprise 100 filters. In that case, the index of the filters varies from 1 to 100.

The same signal S_Cor is independently filtered by each filter of the set of band-pass filters. When the set of band-pass filters comprises 100 filters, the result is 100 filtered signals, each filtered signal being the result of a filtering operation according to a different central frequency.

Figure 6:
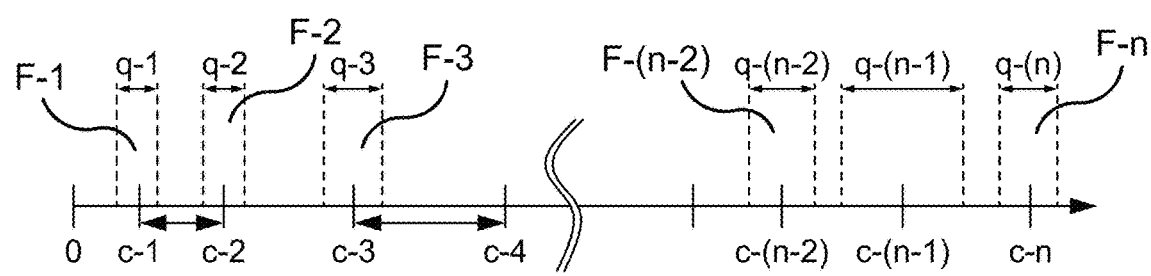
FIG. 6 is a diagram illustrating the set of band-pass filters implemented in an embodiment of the proposed method.

FIG. 6 illustrates an example of a set of band-pass filters F-1, F-2, ..., F-n.
The axis represents the frequency.
The first band-pass filter F-1 has a central frequency c-1 and a bandwidth q-1.
The lower cut-off frequency of the first filter F-1 is thus: $(c-1)-(q-1)/2$, and the upper cut-off frequency of this first filter F-1 is thus: $(c-1)+(q-1)/2$.
Similarly, the $k^{th}$ filter, which is the filter of rank k is the set, has a central frequency equal to (c-k), a bandwidth equal to (q-k), a lower cut-off frequency equal to $(c-k)-(q-k)/2$ and an upper cut-off frequency equal to $(c-k)+(q-k)/2$.
The central frequencies c-1, c-2, ..., c-n are sorted in ascending order.

In this example, the intervals between two consecutive central frequencies are not necessarily constant. Similarly, the intervals between the respective lower cut-off frequency and the respective upper cut-off frequency of the different band-pass filters are not necessarily constant. For example, it may be interesting to have shorter intervals in the low frequency range than in the higher frequency range, to have more resolution in the low frequency range.

The central frequencies (c-1, ..., c-n) and the respective bandwidth (q-1, ..., q-n) of the set of band-pass filters (F-1, ..., F-n) are selected so that the different filters don't overlap each other in the frequency range. In other words, the upper cut-off frequency of a given filter (F-k) is lower than the lower cut-off frequency of the filter (F-(k+1)) which follows in the sorted list of central values. Similarly, the lower cut-off frequency of a given filter (F-k) is higher than the upper cut-off frequency of the filter (F-(k−1)) preceding in the sorted list of central values.

Figure 7:
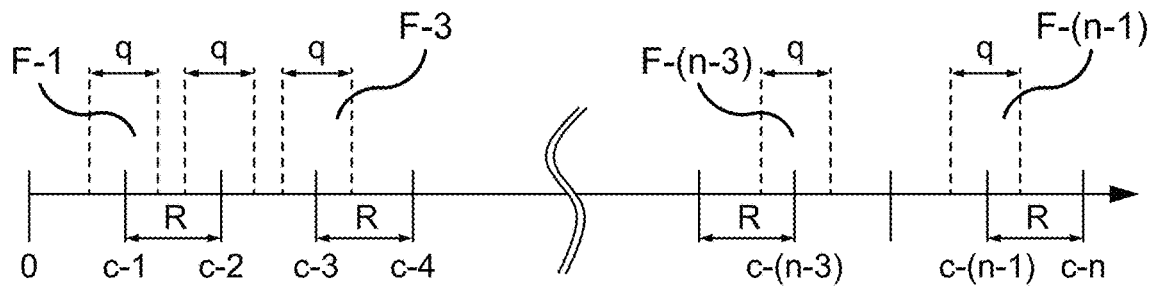
FIG. 7 is a diagram illustrating the set of band-pass filters implemented in another embodiment of the proposed method.

FIG. 7 illustrates another example of a set of band-pass filters F-1, F-2, ..., F-n. In this example, the central frequencies (c-1, ..., c-n) of the set of band-pass filters (F-1, ..., F-n) form an arithmetic progression of common difference R, and the bandwidth q of the set of band-pass filters (F-1, ..., F-n) is constant.

The common difference R of the central frequencies (c-1, ..., c-n) of the set of band-pass filters (F-1, ..., F-n) is for example 2.5 Hz. The bandwidth q of each band-pass filter (F-1, ..., F-n) is for example 2 Hz. The first filter F-1 has a central frequency equal to 2,5 Hz, and a bandwidth equal to 2 Hz. The lower cut-off frequency of the first filter F-1 is thus 1.5 Hz and the upper cut-off frequency is 3.5 Hz. The second filter F-2 has a central frequency of 5 Hz, and a bandwidth of 2 Hz. The lower cut-off frequency of the second filter F-2 is thus 4 Hz and the upper cut-off frequency is 6 Hz. The hundredth band-pass filter has a central frequency equal to 250 Hz, a lower cut-off frequency equal to 249 Hz and an upper cut-off frequency equal to 251 Hz.

As before, the bandwidth of the band-pass filters do not overlap each other. There is a gap between the upper cutoff frequency of a given filter F-k and the lower cut-off frequency of the consecutive filter F-(k+1), i.e the filter with the immediately superior index.

At step (iv), the stator frequency Fs is the frequency of the stator 6 current pulses. It is expressed in Hertz. The rotor frequency Fr is the inverse of the rotation speed of the rotor 5. The rotor frequency Fr correspond for example to the value of the filtered signal S_filt on FIG. 2.

With induction motors, rotor frequency Fr is different from stator frequency Fs because of the rotor slip. With motor types other than induction motors, rotor frequency may be equal to stator frequency. The disclosed method is still applicable.

Figure 8:
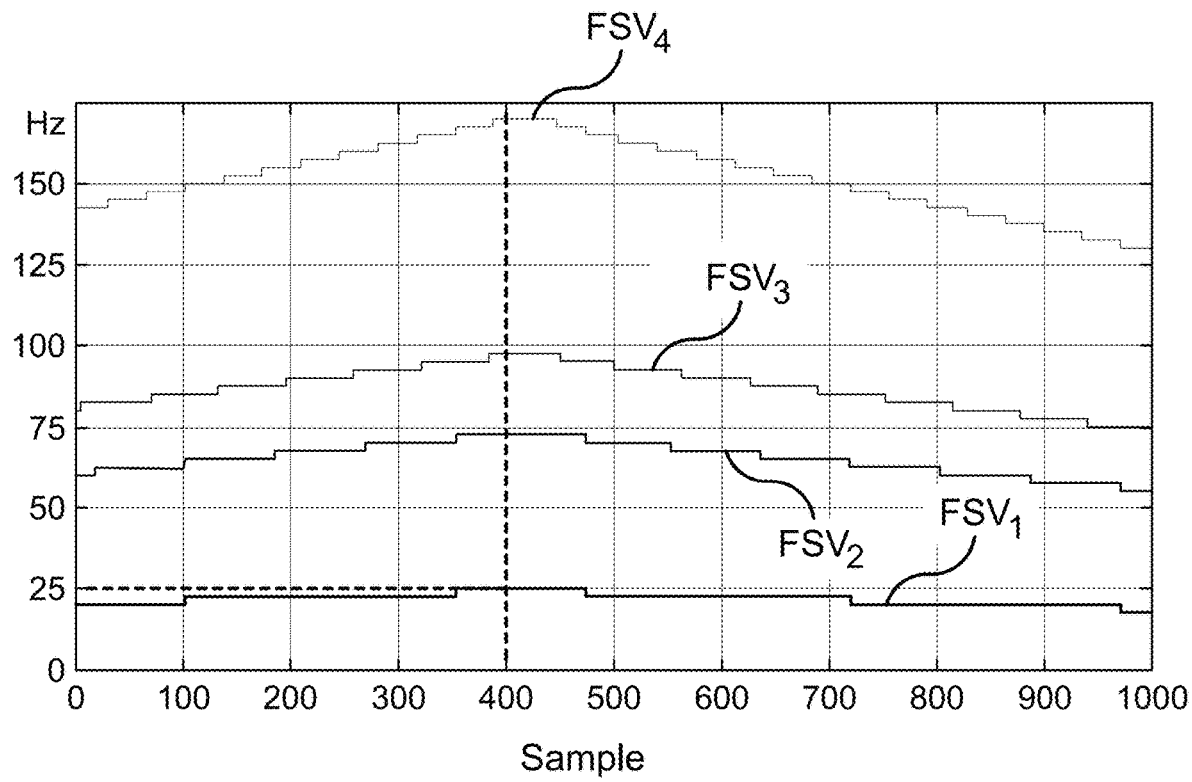
FIG. 8 is a time chart illustrating another step of the method.

FIG. 8 illustrates step (v) of computation of a frequency signature vector FSV.
In the example of FIG. 8, the signature vector comprises 4 components ($FSV_1$, $FSV_2$, $FSV_3$, $FSV_4$), with:
the first component $FSV_1$ equal to the stator frequency Fr,
the second component $FSV_2$ equal to the sum of stator frequency Fs and rotor frequency Fr,
the third component $FSV_3$ equal to the stator frequency Fs multiplied by a factor of 2,
the fourth component $FSV_4$ equal to the sum of the stator frequency Fs multiplied by a factor of 3 and the rotor frequency Fr.

The four components of the signature vector FSV are in this case:

$$FSV_1 = Fs$$

$$FSV_2 = Fs + Fr$$

$$FSV_3 = 2*Fs$$

$$FSV_4 = 3*Fs + Fr$$

The coefficients of the linear combination of stator frequency Fs and rotor frequency Fr are thus:
For the first component $FSV_1$ of the frequency signature vector FSV, $a_1=1$ and $b_1=0$, For the second component $FSV_2$, $a_2=1$ and $b_2=1$,
For the third component $FSV_3$, $a_3=2$ and $b_3=0$,
For the fourth component $FSV_4$, $a_4=3$ and $b_4=1$.

FIG. 8 illustrates the frequency signature vector FSV associated with the data of FIG. 2. On this curve, at sample 400, the first component $FSV_1$ of the frequency signature vector is equal to 25 Hz. For the same instant, the second component of the vector $FSV_2$ is equal to 71.

According to non-represented embodiments, the frequency signature vector may comprise more than 4 components.

Then step (vi-1) makes a correspondence between the computed value of each component $FSV_k$ of the frequency signature vector FSV and a band-pass filter F-r. More precisely, this step determines which of the filters from the set of band-pass filters has its central frequency c-r which is closest to the value $FSV_k$.

For example, if one component $FSV_k$ has a value of 54 Hz, and the 21$^{st}$ band-pass filter has a central frequency of 52.5 Hz while the 22$^{nd}$ band-pass filter has a central frequency of 55 Hz, this 22$^{nd}$ band-pass filter will be selected, as this is the central frequency closest to 54 Hz. Consequently, the output value of the 22$^{nd}$ filter will be attributed to the corresponding sample of component k ($TSV_k$) of temporal symptom vector TSV. The determination of the filter whose central frequency is closest to the computed value of component $FSV_k$ can for example be performed by a loop-up table. The predefined central frequencies of the set of band-pass filters may be the breakpoints of the look-up table. The identification of the filter with the closest central frequency is equivalent to finding the closest breakpoint from the computed value of $FSV_k$.

In the particular embodiment of the detection method in which the central frequencies (c-1, ..., c-n) of the set of band-pass filters (F-1, ..., F-n) form a arithmetic progression of common difference R and the bandwidth q of the set of band-pass filters (F-1, ..., F-n) is constant, at step (vi-1) the band-pass filter F-r of central frequency c-r which is closest to the value $FSV_k$ for time sample $t_i$ is selected simply by calculating the rounded value V of the ratio of the value $FSV_k$ and of the common difference R, the index of the selected filter F-r being equal to the calculated rounded value V.

In other words, in this particular case the selection of the band-pass filter associated to the component number k of the frequency vector FSV is performed by dividing the value of the component $FSV_k$ by the value R of the common progression, then rounding the obtained result to the closest integer value. This rounded value is the index of the band-pass filter to be selected.

Index of filter to be selected=rounded value ($FSV_k$/R)  (equation 2)

Figure 9:
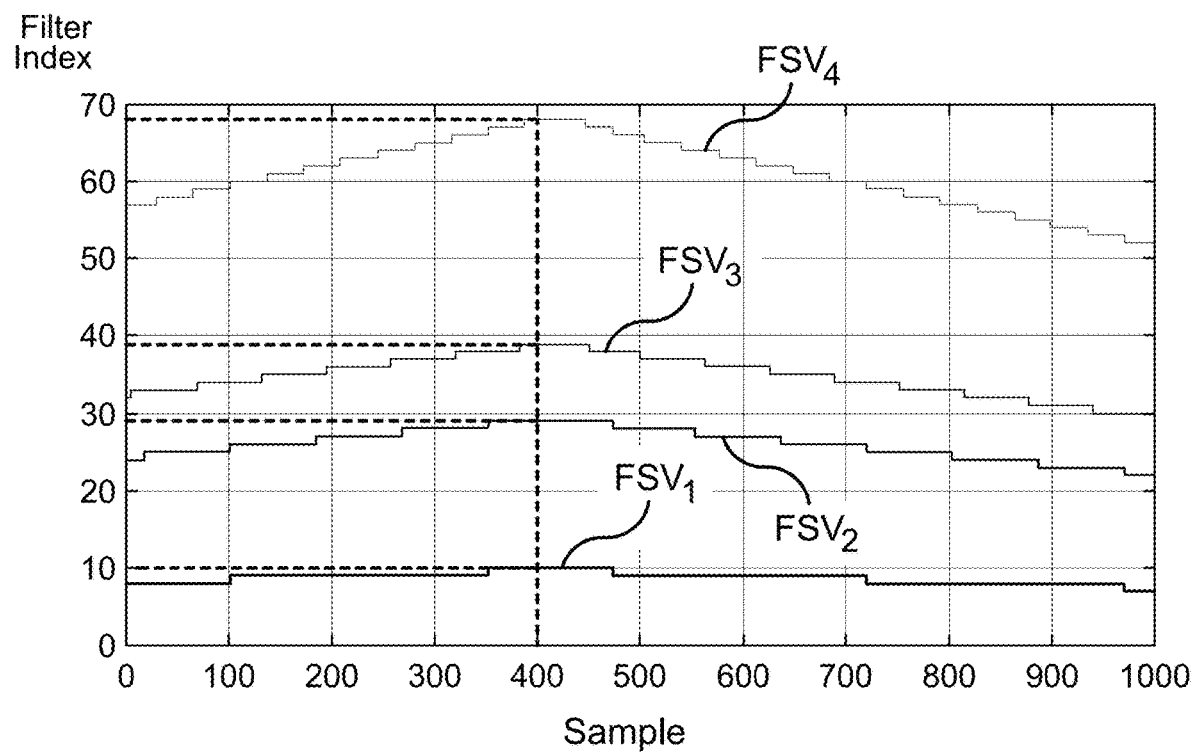
FIG. 9 is another time chart illustrating another step of method.

FIG. 9 illustrates the correspondence between each component $FSV_1$, $FSV_2$, $FSV_3$, $FSV_4$ of the frequency signature vector FSV and the band-pass filter to be associated with, with a common progression of 2.5 Hz. For example, at the time corresponding to the sample n° 400, the 10$^{th}$ filter is associated with the first component $FSV_1$. The result is obtained by dividing the value of the frequency signature vector by the common progression of the set of filters, therefore 25/2.5 giving 10. At the same time instant, the second component of the frequency signature vector is associated with the 28$^{th}$ filter, of index 28.

At a given time instant, this step is repeated for each component $FSV_k$ of the frequency signature vector FSV. Then the process is iterated for each time instant of the acquisition window.

Figure 10:
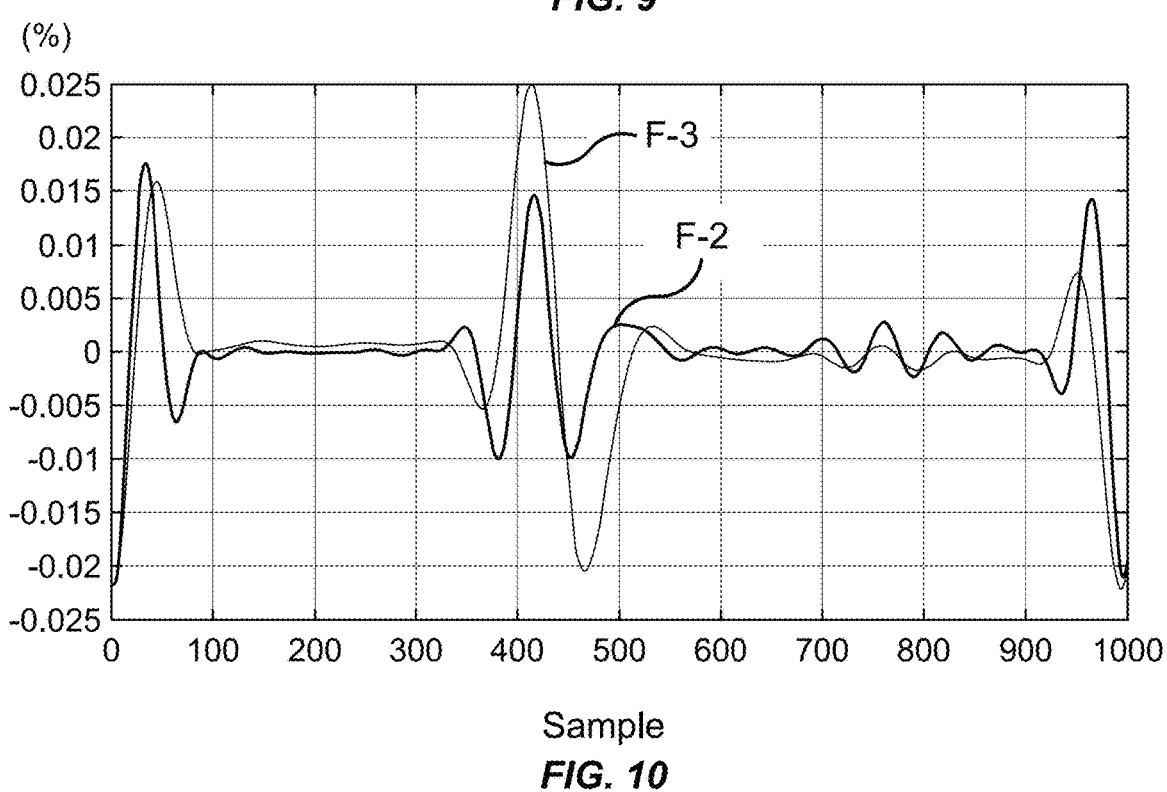
FIG. 10 is another time chart illustrating another step of method.

FIG. 10 illustrates the output value of two individual filters, F-2 and F-3, for each time sample of the acquisition window W.

Figure 11:
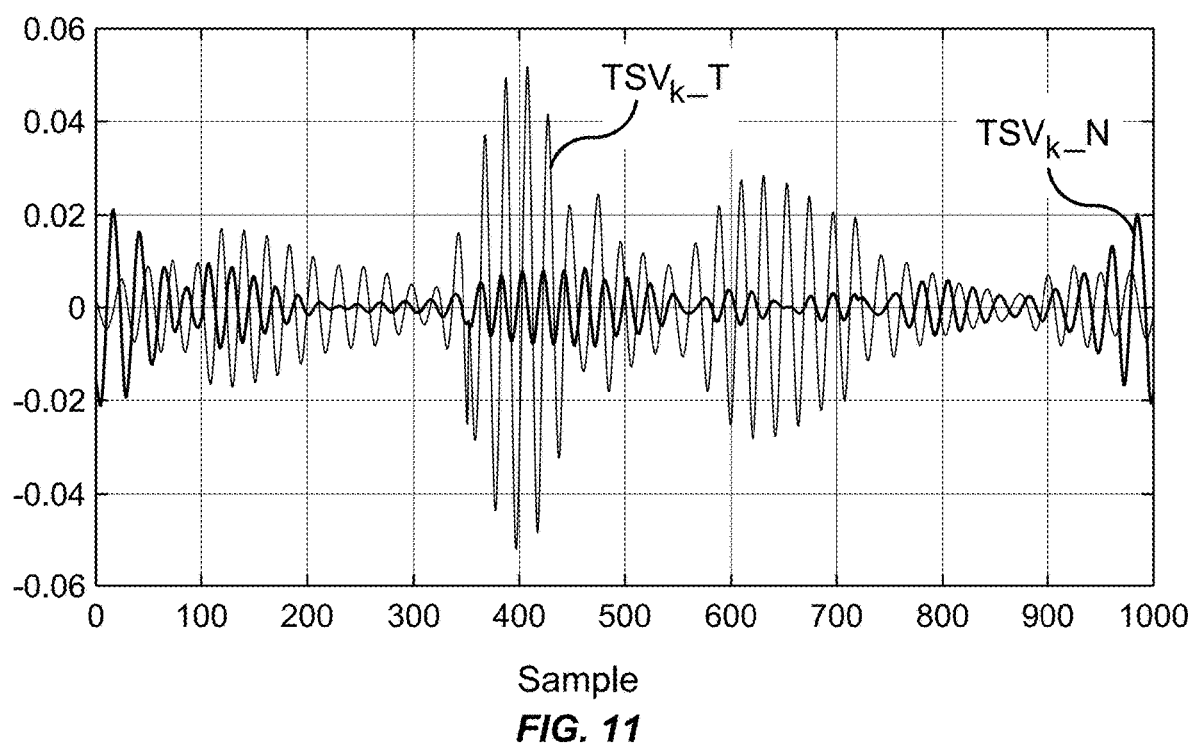
FIG. 11 is another time chart illustrating another step of method.
Figure 12:
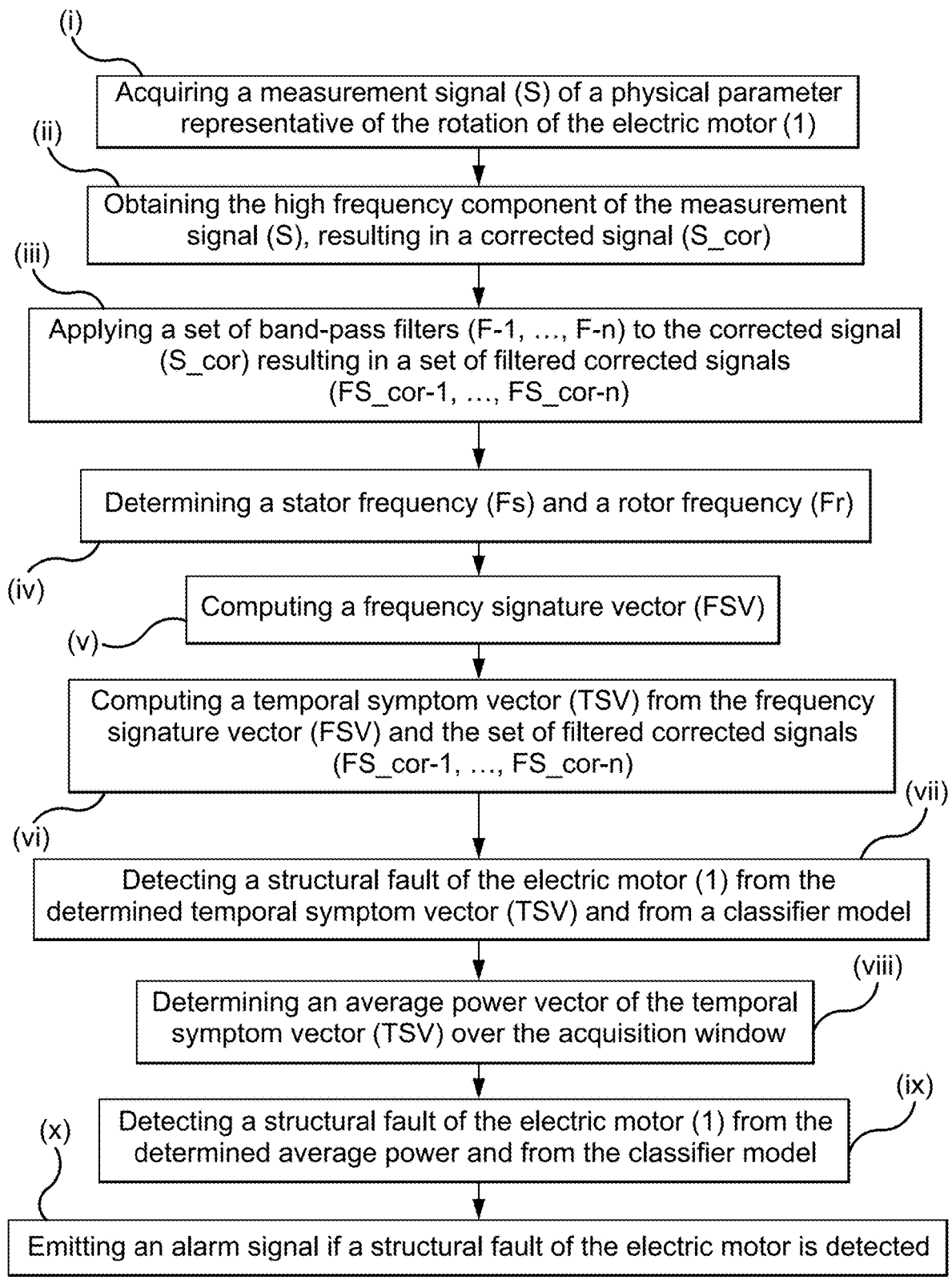
FIG. 12 is a block diagram of different steps of an embodiment of the proposed method.

FIG. 11 illustrates the result of step (vi-3), in which the temporal symptom vector TSV is computed, and represent one component of the temporal symptom vector TSV. The thin-line curve referenced to by the sign $TSV_k\_N$ corresponds to the example of FIG. 2 and FIG. 3, in which the measurement signal S is the torque of the electric motor 1. The bold line curve referenced to by the sign $TSV_k\_T$ corresponds to the example of FIGS. 4 and 5, in which the measurement signal S is the torque of the electric motor 1.

In an embodiment of the detection method, at step (vi-2) the output value of the selected band-pass filter F-r is a root mean square value of all the instant values taken by the selected band-pass filter F-r between the start of the acquisition window W and the time sample $t_i$.

In other words, the output values considered for the detection method are not instant values of the band-pass filters but averaged values, according to root mean square calculation, of these band-pass filters. This embodiment has not been represented.

In another embodiment, the detection method comprises the steps:
(viii) Determining an average power vector APV of the temporal symptom vector TSV over the acquisition window W,
(ix) Detecting a structural fault of the electric motor 1 from the determined average power APV and from the classifier model.

Each component $APV_k$ of the average power vector APV may be determined from the root mean square value of the corresponding component $TSV_k$ of the temporal symptom vector TSV over the acquisition window W.

The component number k of the average power vector APV, $APV_k$, is computed from the equation:

$$APV_k = \sqrt{\Sigma_{i=1}^{p}((TSV_k(i) - \text{average}(TSV_k))^2} \quad \text{(equation 3)}$$

in which the index i corresponds to the number of the time sample in the acquisition window W. As the acquisition window W comprises p samples, index i varies between 1 and p.

$TSV_k(i)$ is the sample number i of component number k of the temporal symptom vector TSV.

In other words, in this embodiment, the filtering is first performed, and the determination of the average power is performed on the filtered values.

The proposed detection method can rely on a single measurement signal S, like motor rotational speed, or motor torque, as exposed earlier.

In a particular embodiment of the method, the steps (i) to (vii) are iterated with a rotational speed of a rotor 5 of the electric motor 1 as the physical parameter representative of the rotation of the electric motor 1 and in which the steps (i) to (vii) are iterated in parallel with a torque delivered by the electric motor 1 as the physical parameter representative of the rotation of the electric motor 1.

In other words, the disclosed method may rely on speed measurement only, may rely on torque measurement only, and may also rely on both speed and torque used simultaneously.

According to an aspect of the method, the steps (i) to (vii) are iterated for a set of acquisition windows (W-1, ..., W-p), resulting in a set of data representative of the operation of the electric motor. A database of samples is built, preferably covering a broad scope of operation conditions of the electric motor 1 integrated in the industrial equipment 20. The set of data representative of the operation of the electric motor is used by the classifier model.

In an embodiment of the method, the classifier model is a machine learning classifier.

According to an aspect of the method, the machine learning classifier is trained, in a calibration phase, with a first set of data representative of an operation of the electric motor 1 in nominal condition and with at least a second set of data representative of an operation of the electric motor 1 with a structural fault to be detected.

The fault to be detected is introduced when setting-up the equipment 20 comprising the electric motor 1. For example, the fixings of the electric motor 1 may be voluntarily torqued to values lower than the recommended values, and some data samples are then collected. For another run of experiments, the electric motor 1 may be voluntarily misaligned relatively to the driven load 2. For yet another experiment, a mass can be added to the rotor 5 of the electric motor 1 in order to emulate an unbalance. In a similar way, electrical faults can be voluntarily introduced, like partial short circuit of stator windings, or rotor bar cracks. For a given functional fault, different severities of the fault can be characterized, for example different misalignments of growing amplitudes. Training the classifier model with data compiling a broad range of fault with various severities improve the compromise between misdetection and false detection.

The nominal condition of the electric motor 1 corresponds to an operation with no fault of any kind. The condition of the electric motor 1 is checked by other methods than the proposed method before training the machine learning classifier.

Preferably, the machine learning classifier is trained with a plurality of sets of data, each set of data corresponding to a structural fault to be detected.

As stated earlier, a wide range of structural faults can be detected, such as rotor unbalance, rotor warp, rotor bearing damage, varying airgap, motor misalignment, motor incorrect fixing, drive belt under/overtension, geartrain issue, for the family of mechanical issues, and for example insulation fault or rotor bar cracks for the family of electrical issues.

In an embodiment of the method, the machine learning classifier can be a neural network, for example a convolutional neural network.

The neural network may comprise an input layer with a number of neurons comprised between 2 and 20. The neural network may comprise a number of hidden layers comprised between 2 and 5. The neural network may comprise an output layer with a number of neurons comprised between 2 and 20. The number of neurons of the output layer is adapted to the number of different structural faults that have been characterized and that are to be detected. Each fault to be detected corresponds to one output neuron, plus one corresponding to a "no fault" status.

The proposed method also comprises the step:
(x) emitting an alarm signal if a structural fault of the electric motor 1 is detected.

The alarm signal may be a message displayed on a control screen. The alarm signal may be a fault code stored in a motor controller. The alarm signal may be a sound signal.

A corrective action may be carried out in function of the received alarm signal. Early corrective action can be taken. Routine maintenance activities, defined at fixed time intervals, may be delayed thanks to the proposed method. Operation time between maintenance operation may be extended.

The disclosure also relates to an electronic module 10 configured for implementing a method as described earlier. The electronic module 10 may be a speed/torque controller of the electric motor 1. The proposed method can be directly integrated in the speed/torque controller 7 of the electric motor 1. The electronic module 10 can also be a dedicated monitoring system.

The invention claimed is:

1. A method for detecting a structural fault of an electric motor, comprising the steps:
  (i) acquiring, during an acquisition window of predetermined duration, a measurement signal of a physical parameter representative of the rotation of the electric motor, at a predefined sampling frequency,
  (ii) obtaining the high frequency component of the measurement signal, resulting in a corrected signal,
  (iii) applying a set of band-pass filters to the corrected signal, each band-pass filter having a central frequency and a bandwidth, the central frequencies of the band-pass filters being in ascending order and the bandwidth being separated from each other, each band-pass filter having an index corresponding to the rank of the central frequency in a sorted list of the central frequencies, resulting in a set of filtered corrected signals,
  (iv) determining a stator frequency and a rotor frequency of the electric motor,
  (v) computing a frequency signature vector comprising a plurality of components, each component of the frequency signature vector being a predefined linear combination of the stator frequency and of the rotor frequency, from the equation:

$$FSV_k = a_k * Fs + b_k * Fr,$$

wherein $FSV_k$ is a component of the frequency signature vector, Fs is the stator frequency, Fr is the rotor frequency and the coefficients $a_k$, $b_k$ are predefined integers,
  (vi) computing a temporal symptom vector from the computed frequency signature vector and from the set of filtered corrected signals, the temporal symptom vector comprising a plurality of components, the computation comprising the sub-steps:
    (vi-1) for each time sample of the acquisition window and each component of the frequency signature vector, selecting the band-pass filter of central frequency which is closest to the value of the component for the time sample,
    (vi-2) affecting the output value of the selected band-pass filter to the component number k of the temporal symptom vector for the time sample,
    (vi-3) iterating steps (vi-1) and (vi-2) for all time samples of the acquisition window, resulting in a temporal symptom vector,
  (vii) detecting a structural fault of the electric motor from the determined temporal symptom vector and from a classifier model.

2. The method according to claim 1, in which:
  at step (iii), the central frequencies of the set of band-pass filters form a arithmetic progression of common difference, and the bandwidth of the set of band-pass filters is constant,
  at step (vi-1) the band-pass filter of central frequency which is closest to the value for the time sample is selected by calculating the rounded value of the ratio of the value and of the common difference, the index of the selected filter being equal to the calculated rounded value.

3. The method according to claim 1, in which the step of obtaining the high frequency component of the measurement signal comprises the sub-steps:
(ii-1) applying a low-pass filter to the acquired measurement signal, resulting in a filtered value,
(ii-2) subtracting the filtered value from the acquired measurement signal, resulting in the corrected signal.

4. The method according to claim 1, in which the step of obtaining the high frequency component of the measurement signal comprises the sub-step:
(ii-1) applying a high-pass filter to the acquired measurement signal, resulting in the corrected signal.

5. The method according to claim 1, in which the physical parameter representative of the rotation of the electric motor is a rotational speed of a rotor of the electric motor.

6. The method according to claim 1, in which the physical parameter representative of the rotation of the electric motor is a rotational speed of electrical frame of a stator of the electric motor.

7. The method according to claim 1, in which the physical parameter representative of the rotation of the electric motor is a torque delivered by the electric motor.

8. The method according to claim 1, in which the physical parameter representative of the rotation of the electric motor is a phase current of a stator of the electric motor.

9. The method according to claim 1, in which the signature vector comprises four components, with: the first component equal to the stator frequency, the second component equal to the sum of stator frequency and rotor frequency, the third component equal to the stator frequency multiplied by a factor of 2, the fourth component equal to the sum of the stator frequency multiplied by a factor of 3 and the rotor frequency.

10. The method according to claim 1, in which at step (vi-2) the output value of the selected band-pass filter is a root mean square value of all the instant values taken by the selected band-pass filter between the start of the acquisition window and the time sample.

11. The method according to claim 1, further comprising the steps:
(viii) determining an average power vector of the temporal symptom vector over the acquisition window,
(ix) detecting a structural fault of the electric motor from the determined average power and from the classifier model.

12. The method according to claim 11, in which each component of the average power vector is determined from the root mean square value of the corresponding component of the temporal symptom vector over the acquisition window.

13. The method according to claim 1, in which the steps (i) to (vii) are iterated with a rotational speed of a rotor of the electric motor as the physical parameter representative of the rotation of the electric motor and in which the steps (i) to (vii) are iterated in parallel with a torque delivered by the electric motor as the physical parameter representative of the rotation of the electric motor.

14. The method according to claim 1, in which the classifier model is a machine learning classifier.

15. The method according to claim 14, in which the machine learning classifier is trained, in a calibration phase, with a first set of data representative of an operation of the electric motor in nominal condition and with at least a second set of data representative of an operation of the electric motor with a structural fault to be detected.

16. The method according to claim 14, in which the machine learning classifier can be a neural network, for example a convolutional neural network.

17. The method according to claim 1, further comprising the step:
(x) emitting an alarm signal if a structural fault of the electric motor is detected.

18. An electronic module configured for implementing the method according to claim 1.

19. A controller configured for implementing the method according to claim 1.

20. The controller of claim 19, wherein the controller comprises a speed/torque controller of the electric motor.

* * * * *